US010509329B2

(12) United States Patent
Veeraraghavan et al.

(10) Patent No.: US 10,509,329 B2
(45) Date of Patent: Dec. 17, 2019

(54) BREAKDOWN ANALYSIS OF GEOMETRY INDUCED OVERLAY AND UTILIZATION OF BREAKDOWN ANALYSIS FOR IMPROVED OVERLAY CONTROL

(71) Applicant: KLA-Tencor Corporation, Milpitas, CA (US)

(72) Inventors: Sathish Veeraraghavan, Santa Clara, CA (US); Chin-Chou Huang, Pleasanton, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 814 days.

(21) Appl. No.: 14/597,062

(22) Filed: Jan. 14, 2015

(65) Prior Publication Data

US 2016/0062252 A1    Mar. 3, 2016

Related U.S. Application Data

(60) Provisional application No. 62/045,417, filed on Sep. 3, 2014.

(51) Int. Cl.
*G03F 7/20*          (2006.01)

(52) U.S. Cl.
CPC .......... *G03F 7/70625* (2013.01); *G03F 7/705* (2013.01); *G03F 7/70633* (2013.01); *G03F 7/70783* (2013.01)

(58) Field of Classification Search
CPC .. G03F 9/7003; G03F 9/7092; G03F 7/70625; G03F 7/20; H01L 21/681; H01L 21/67253; G06F 17/30
See application file for complete search history.

(56) References Cited

U.S. PATENT DOCUMENTS

| 7,111,256 B2 * | 9/2006 | Seligson | ................. G03F 7/705 |
| | | | 702/35 |
| 2003/0204348 A1 * | 10/2003 | Suzuki | ............ G05B 19/41875 |
| | | | 702/83 |

(Continued)

FOREIGN PATENT DOCUMENTS

JP        2004191305 A      7/2004

OTHER PUBLICATIONS

Lisa Garling and Gavin Woods, "Enhancing the Analysis of Variance (Anova) Technique with Graphical Analysis and its Applicaiton to Wafer Processing Equipment", IEEE Transactions of Components, Hybrids, and Manf. Tech., 17(1) Mar. (1994).*

(Continued)

*Primary Examiner* — Mohamed Charioui
*Assistant Examiner* — Catherine T. Rastovski
(74) *Attorney, Agent, or Firm* — Suiter Swantz pc llo (57) ABSTRACT

Systems and methods for providing improved measurements and predictions of geometry induced overlay errors are disclosed. Information regarding variations of overlay errors is obtained and analyzed to improve semiconductor processes as well as lithography patterning. In some embodiments, a cascading analysis process is utilized to breakdown the wafer geometry induced overlay into various components. The breakdown analysis may also be utilized to determine effectiveness factors for the various components, which in turn may improve the prediction accuracy of the impact of wafer geometry on wafer overlay. Furthermore, the measurements and/or predictions of the wafer geometry induced overlay errors may be utilized to provide overlay monitoring and correction solutions.

26 Claims, 7 Drawing Sheets

(56) References Cited

U.S. PATENT DOCUMENTS

| | | | |
|---|---|---|---|
| 2006/0238761 A1* | 10/2006 | Lin | G03F 7/705 356/401 |
| 2006/0273266 A1 | 12/2006 | Preil et al. | |
| 2008/0228435 A1* | 9/2008 | Lee | G03F 7/705 702/150 |
| 2011/0172982 A1 | 7/2011 | Veeraraghavan et al. | |
| 2012/0208301 A1 | 8/2012 | Izikson et al. | |
| 2013/0219350 A1* | 8/2013 | Lee | G06F 17/5081 716/54 |
| 2013/0258310 A1 | 10/2013 | Smilde et al. | |
| 2013/0323648 A1* | 12/2013 | Chen | G06F 17/5068 430/296 |
| 2014/0107998 A1 | 4/2014 | Vukkadala et al. | |
| 2016/0062250 A1* | 3/2016 | Hung | G03F 7/70633 355/67 |

OTHER PUBLICATIONS

Duane Boning and James Chung, "Statistical Metrology: Tools for Understanding Variation", Futere Fab International, Dec. (1996).*

Ke Huang et al. "Process Monitoring through Wafer-level Spatial Variation Decomposition", International Test Conference 2013.*

Koay et al., "Towards Manufacturing of Advanced Logic Deviced by Double-Patterning", Optical Microlithography XXIV (2011).*

PCT International Search Report for PCT/US2015/047985 dated Nov. 30, 2015, 3 pages.

Chiew-Seng Koay et al., Towards Manufacturing of Advanced Logic Devices by Double-Patterning, Optical Microlithography XXIV, Proceedings of SPIE, Mar. 23, 2011, pp. 79730F-1-79730F-18, vol. 7973, SPIE.

Tuan-Yen Yu et al., Overlay Control Strategy for 45/32nm RD and Production Ramp Up, Metrology, Inspection, and Process Control for Microlithography XXIV, Proceedings of SPIE, Apr. 2, 2010, pp. 76382K-1-76382K-8, vol. 7638, SPIE.

Turner, Kevin T. et al., "Relationship between localized wafer shape changes induced by residual stress and overlay errors", Journal of Micro/Nanolithography, MEMS, and MOEMS, vol. 11, No. 1, Mar. 21, 2012, 9 pages.

Brunner, T. et al., "Characterization and mitigation of overlay error on silicon wafers with nonuniform stress", Visual Communications and Image Processing, vol. 9052, Mar. 31, 2014, 12 pages.

EP Extended Search Report dated Apr. 10, 2018 for European Patent Application No. 15838437.0.

Office Action dated Jun. 4, 2019 for Japanese Patent Application No. 2017-512350.

* cited by examiner

BREAKDOWN ANALYSIS OF GEOMETRY INDUCED OVERLAY AND UTILIZATION OF BREAKDOWN ANALYSIS FOR IMPROVED OVERLAY CONTROL

CROSS-REFERENCE TO RELATED APPLICATIONS

The present application claims the benefit under 35 U.S.C. § 119(e) of U.S. Provisional Application Ser. No. 62/045,417, filed Sep. 3, 2014. Said U.S. Provisional Application Ser. No. 62/045,417 is hereby incorporated by reference in its entirety.

TECHNICAL FIELD

The disclosure generally relates to the field of wafer surface metrology, and particularly to systems and methods for the measurement and prediction of geometry induced overlay errors and general variations of overlay errors.

BACKGROUND

Thin polished plates such as silicon wafers and the like are a very important part of modern technology. A wafer, for instance, may refer to a thin slice of semiconductor material used in the fabrication of integrated circuits and other devices. Other examples of thin polished plates may include magnetic disc substrates, gauge blocks and the like. While the technique described here refers mainly to wafers, it is to be understood that the technique also is applicable to other types of polished plates as well. The term wafer and the term thin polished plate may be used interchangeably in the present disclosure.

Fabricating semiconductor devices typically includes processing a substrate such as a semiconductor wafer using a number of semiconductor fabrication processes. Metrology processes are used at various steps during the semiconductor manufacturing process to monitor and control one or more semiconductor layer processes. One of the characteristics being monitored and controlled is the overlay error. An overlay measurement generally specifies how accurately a first patterned layer aligns with respect to a second patterned layer disposed above or below it or how accurately a first pattern aligns with respect to a second pattern disposed on the same layer. The overlay error is typically determined with an overlay target having structures formed on one or more layers of a work piece (e.g., semiconductor wafer). If the two layers or patterns are properly formed, then the structure on one layer or pattern tends to be aligned relative to the structure on the other layer or pattern. If the two layers or patterns are not properly formed, then the structure on one layer or pattern tends to be offset or misaligned relative to the structure on the other layer or pattern. Overlay error is the misalignment between any of the patterns used at different stages of the semiconductor fabrication processes.

When overlay errors are observed, an overlay measurement may be used to apply corrections and to keep overlay errors within desired limits. For example, overlay measurements may be fed into an analysis routine that calculates scanner corrections, referred to as "correctables", as well as other statistics, which may be used by an operator in order to better align the lithography tool used in the process.

It is noted that one of the error sources affecting the overlay accuracy is wafer geometry. For instance, distortions may occur during fabrication, where chucking of substrates with wafer shape and thickness variations may result in elastic deformation of the wafer that can cause in-plane distortions (IPD). IPD may lead to overlay errors. Therefore, providing the ability to measure and/or predict such wafer geometry induced overlay errors is a vital part of the semiconductor manufacturing process.

SUMMARY

The present disclosure is directed to a method for analyzing wafer geometry induced overlay errors. The method may include: obtaining in-plane distortions or measured overlay for a plurality of wafers, wherein the plurality of wafers includes wafers from multiple lots; and decomposing the in-plane distortions or measured overlay obtained for the plurality of wafers to a plurality of decomposed components utilizing a processor, the plurality of decomposed components including: a common process signature, lot-to-lot variations, and wafer-to-wafer variations.

A further embodiment of the present disclosure is directed to a method for determining effectiveness of an overlay correction process. The method may include: obtaining a first set of in-plane distortions for a plurality of wafers, wherein the plurality of wafers includes wafers from multiple lots and wherein the first set of in-plane distortions obtained for the plurality of wafers represents in-plane distortions of the plurality of wafers prior to application of the overlay correction process; obtaining a second set of in-plane distortions for the plurality of wafers, wherein the second set of in-plane distortions obtained for the plurality of wafers represents in-plane distortions of the plurality of wafers after application of the overlay correction process; decomposing the first set of in-plane distortions to a first set of decomposed components utilizing a processor; decomposing the second set of in-plane distortions to a second set of decomposed components utilizing the processor; and determining an effectiveness factor of the overlay correction process for at least one decomposed component based on a comparison between the first set of decomposed components and the second set of decomposed components.

A further embodiment of the present disclosure is directed to a method for monitoring wafer fabrication. The method may include: analyzing a first set of wafers to determine an effectiveness factor of an overlay correction process utilized in wafer fabrication, wherein the first set of wafers includes wafers from multiple lots; obtaining in-plane distortions for a second set of wafers, wherein the second set of wafers includes wafers from multiple lots; decomposing the in-plane distortions of the second set of wafers to a plurality of decomposed components, the plurality of decomposed components including: a common process signature, higher order polynomial model lot-to-lot variations, higher order polynomial model wafer-to-wafer variations, corrections per exposure (CPE) model common signature, and CPE model wafer-to-wafer variations; calculating a total geometry induced overlay variation for the second set of wafers based on a weighted sum of the plurality of decomposed components, wherein at least one decomposed component of the plurality of decomposed components is weighted at least partially based on the effectiveness factor of the overlay correction process; and determining whether the second set of wafers satisfies an established specification based on comparison of the total geometry induced overlay variation for the second set of wafers against the established specification.

A further embodiment of the present disclosure is directed to a system. The system may include a measurement device configured to obtain wafer geometry data from a first set of wafers, wherein the first set of wafers includes wafers from multiple lots. The system may also include an analyzer in communication with the measurement device. The analyzer may be configured to: calculate a first set of in-plane distortions for the first set of wafers; and decompose the first set of in-plane distortions to a first set of decomposed components, the first set of decomposed components including: a common process signature, higher order polynomial model lot-to-lot variations, higher order polynomial model wafer-to-wafer variations, CPE model common signature, and CPE model wafer-to-wafer variations.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

In typical fabrication operations, semiconductor manufacturing processes are run in batches called lots. A lot, or a wafer lot, is defined as a quantity of wafers which are processed together as a single group. Conventional overlay monitor and control techniques generally take a single set of scanner corrections and apply the same set for all wafers in the same lot. However, it is noted that if a single set of such scanner corrections is taken for all wafers in a given lot and then applied to a subsequent lot for overlay correction, the effectiveness of this single set of scanner corrections is limited. In addition, when wafers with different shapes (geometry signatures) come into the scanner, the scanner corrections, extrapolations and/or interpolations are not optimized and are often over adjusted because existing algorithms are not aware of the wafer geometry changes.

Embodiments of the present disclosure are directed to systems and methods for providing improved measurements and predictions of geometry induced overlay errors. In accordance with embodiments of the present disclosure, information regarding variations of the overlay errors is obtained and analyzed to improve the measurement and prediction accuracies. More specifically, a cascading analysis process is utilized to breakdown (decompose) the wafer geometry induced overlay into various components. The various decomposed components may include common process signatures, lot-to-lot variations, wafer-to-wafer variations, as well as other additional components that will be described later in details. The breakdown analysis may also be utilized to determine effectiveness factors for the various decomposed components, which in turn may improve the overlay correction solutions. Furthermore, the measurements and/or predictions of the wafer geometry induced overlay errors may be utilized in various types of feedback or feed-forward control loops to provide overlay monitoring and correction solutions.

Figure 1:
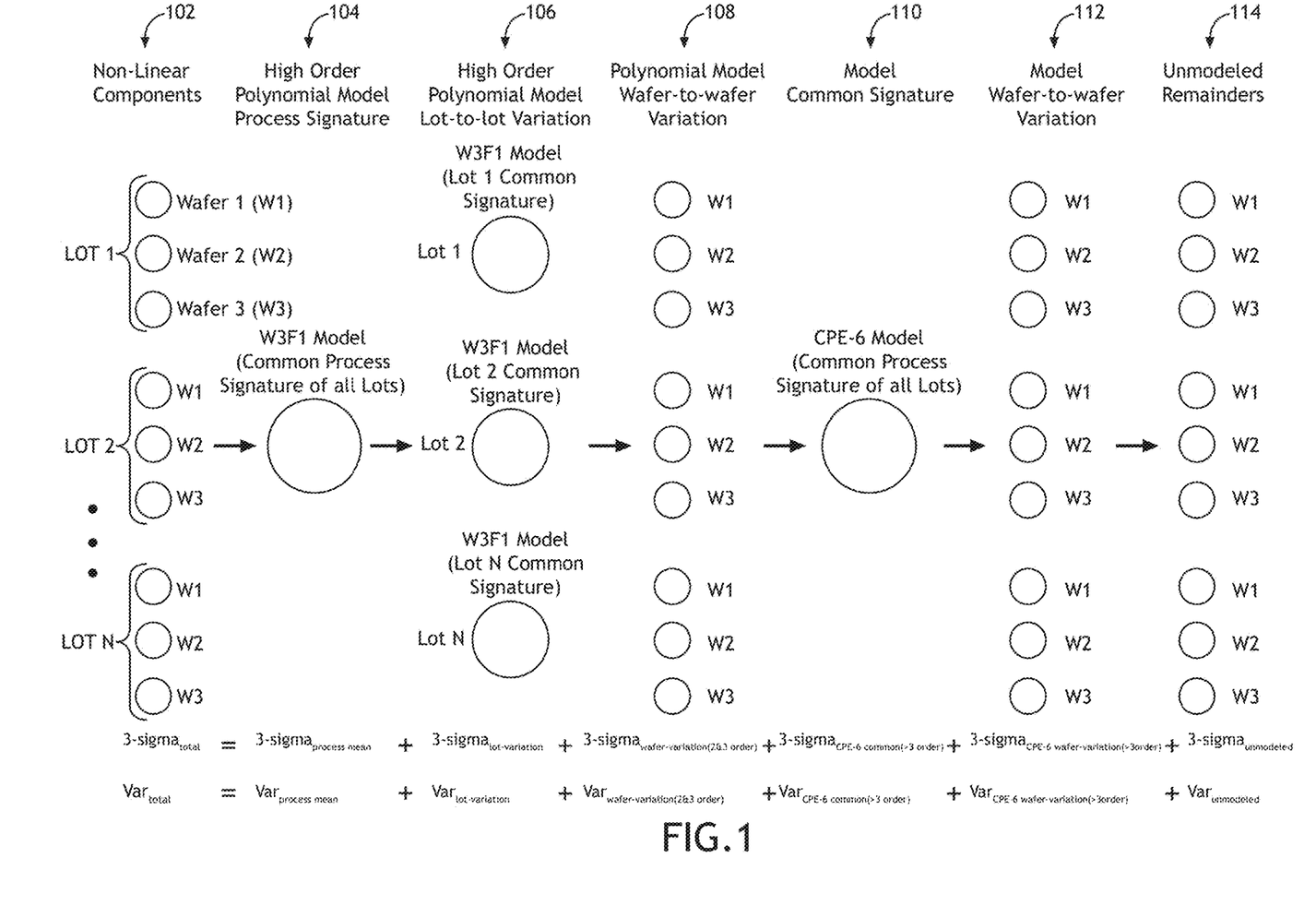
FIG. 1 is an illustration depicting a breakdown of various components of wafer geometry induced overlay data.

Referring to FIG. 1, an illustration depicting decomposition of the geometry induced overlay is shown. It is noted that in the cascading methodology as utilized in embodiments of the present disclosure, the sum of variance of the various decomposed components (represented by columns 104 through 114) equals the variance of geometry induced overlay (represented by column 102) before decomposition. More specifically, the geometry induced overlay may be represented using in-plane distortions (IPD) 102 of each wafer of a plurality of wafers. It is to be understood that the IPD 102 may be an actual IPD measured for a wafer (e.g., measured upon completion of a particular fabrication process). Alternatively, the IPD 102 may be a predicted IPD estimated for a wafer (e.g., estimated prior to a particular fabrication process). It is contemplated that various types of measurement tools and/or prediction models, such as those described in: System and Method to Emulate Finite Element Model Based Prediction of In-Plane Distortions due to Semiconductor Wafer Chucking, U.S. Pat. No. 9,430,593, which is herein incorporated by reference in its entirety, may be utilized to obtain the IPDs 102 for the plurality of wafers. It is also contemplated that various other types of measurement tools and/or prediction models may be utilized as well without departing from the spirit and scope of the present disclosure.

As depicted in FIG. 1, the wafers included in this analysis may include wafers(e.g., W1, W2, W3, or the like) across multiple lots 1, 2 ... N. It is to be understood that while lots 1, 2 ... N as shown in FIG. 1 each includes three wafers, this depiction is merely exemplary for illustrative purposes; the number of lots that can be included in this analysis, and the number of wafers that can be included in each lot, may vary without departing from the spirit and scope of the present disclosure.

In accordance with some embodiments of the present disclosure, the IPDs 102 can be decomposed into the various components shown in FIG. 1. The decomposed components may include process signatures 104 that are common across all wafers in all lots, lot-to-lot(L2L) variations 106, wafer-to-wafer (W2W) variations 108, a common residual 110 across all wafers, higher order wafer-to-wafer variations 112, and remainders 114 that do not belong to decomposed components 104 through 112. It is contemplated that the IPD can be decomposed even further without departing from the spirit and scope of the present disclosure. For instance, a model may be utilized to describe the common features present in the remainders 114. However, if the remainders 114 appear to be relatively insignificant for the purposes of measurement and prediction of geometry induced overlay errors, the remainders 114 may be left unmodeled.

It is contemplated that various statistical models may be utilized to extract the process signatures 104 that are common across all wafers in all lots. For example, the process signatures 104 may be calculated by fitting a high order polynomial model such as wafer level $3^{rd}$ order and field level $1^{st}$ order model (e.g., a W3F1 model) and averaging the modeled components of all wafers. Once the process signatures 104 are extracted, a series of subtractions may be performed to calculate the rest of the components 106 through 114.

More specifically, to calculate the lot-to-lot variations 106, the process signatures 104 may be subtracted from the IPD 102 of each wafer, and the resulting IPD may then be processed using a statistical model (e.g., high order polynomial models and averaging) to extract a signature 106 that is common across the wafers in each particular lot. Once the common signature for each lot is calculated, the variation between each lot may be quantified by metrics such as variance and/or standard deviation (e.g., 3-σ). Similarly, to calculate the high order wafer-to-wafer variations 108, the process signatures 104 and the lot-to-lot variations 106 may be subtracted from the IPD 102 of each wafer and the resulting IPD may then be processed using a statistical model (e.g., high order polynomial models including a selected wafer level order and a field level $2^{nd}$ order and/or $3^{rd}$ order model, or F2+3; and averaging).

The wafer-to-wafer variations 108 may also be further decomposed to extract common systematic higher order signature 110 (may also be referred to as corrections per exposure polynomial model signature) that is common across the wafers using a statistical model (e.g., corrections per exposure polynomial model and averaging). It is noted that corrections per exposure (CPE) is a common technique used in lithography tools, where a set of positional corrections may be stored and applied on a per exposure basis to correct particular forms of distortions. For example, the CPE technique used may include a CPE-6 (or CPE6 or $CPE_6$) model, where a CPE model includes six terms per field. Once the common CPE model signature 110 has been extracted, the wafer-to-wafer CPE signature variations 112 may then be calculated by subtracting the process signatures 104, the lot-to-lot variations 106, the high order polynomial model wafer-to-wafer variations 108, and the common CPE model signature 110 from the IPD 102 of each wafer.

Once the process signatures 104, the lot-to-lot variations 106, the high order polynomial model wafer-to-wafer variations 108, the common CPE signature 110, and wafer-to-wafer CPE variations 112 are obtained, they can all be subtracted from the IPD 102 of each wafer to obtain the remainders 114. The remainders 114 may be left unmodeled in some embodiments.

Figure 2:
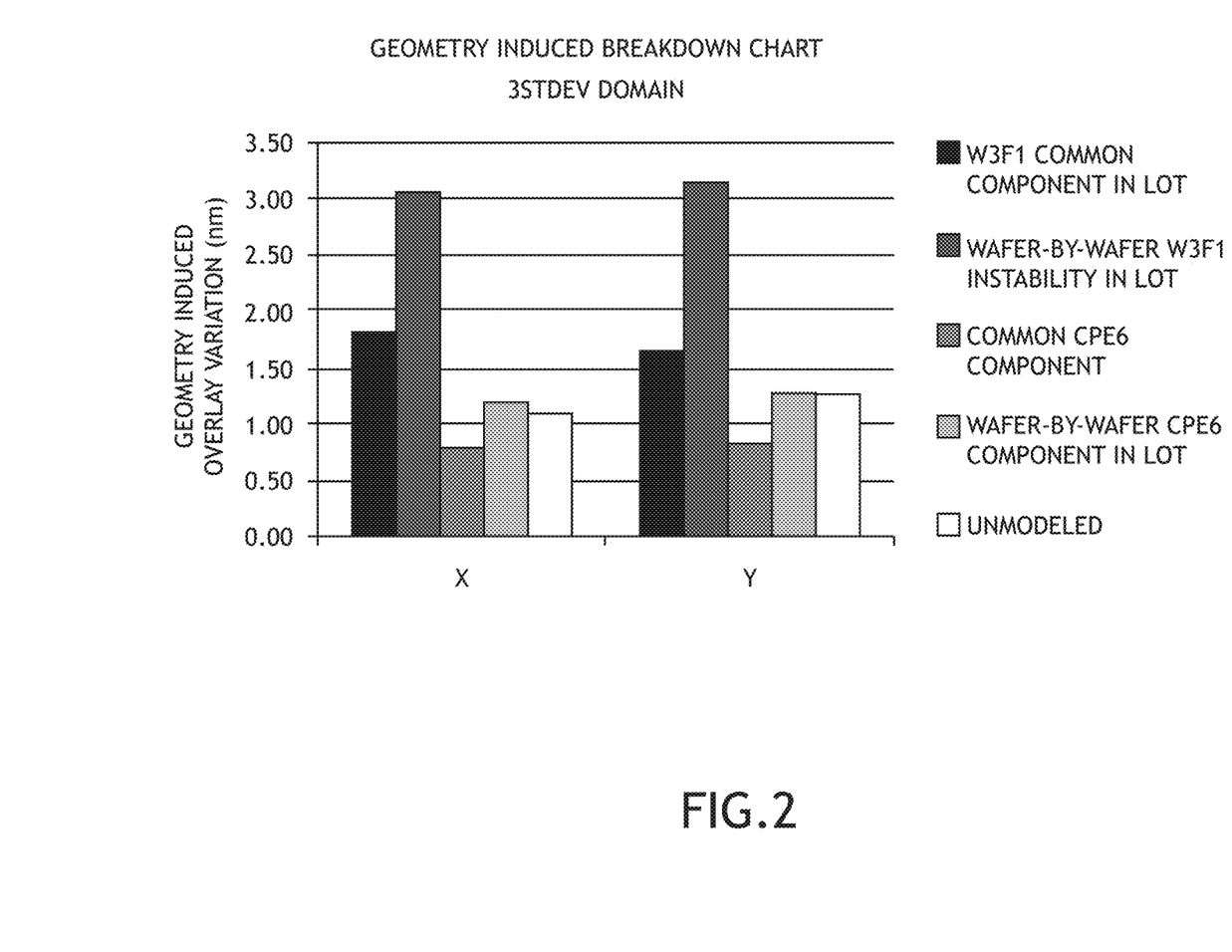
FIG. 2 is an illustration depicting a graphical representation of the breakdown analysis in a standard deviation domain.
Figure 3:
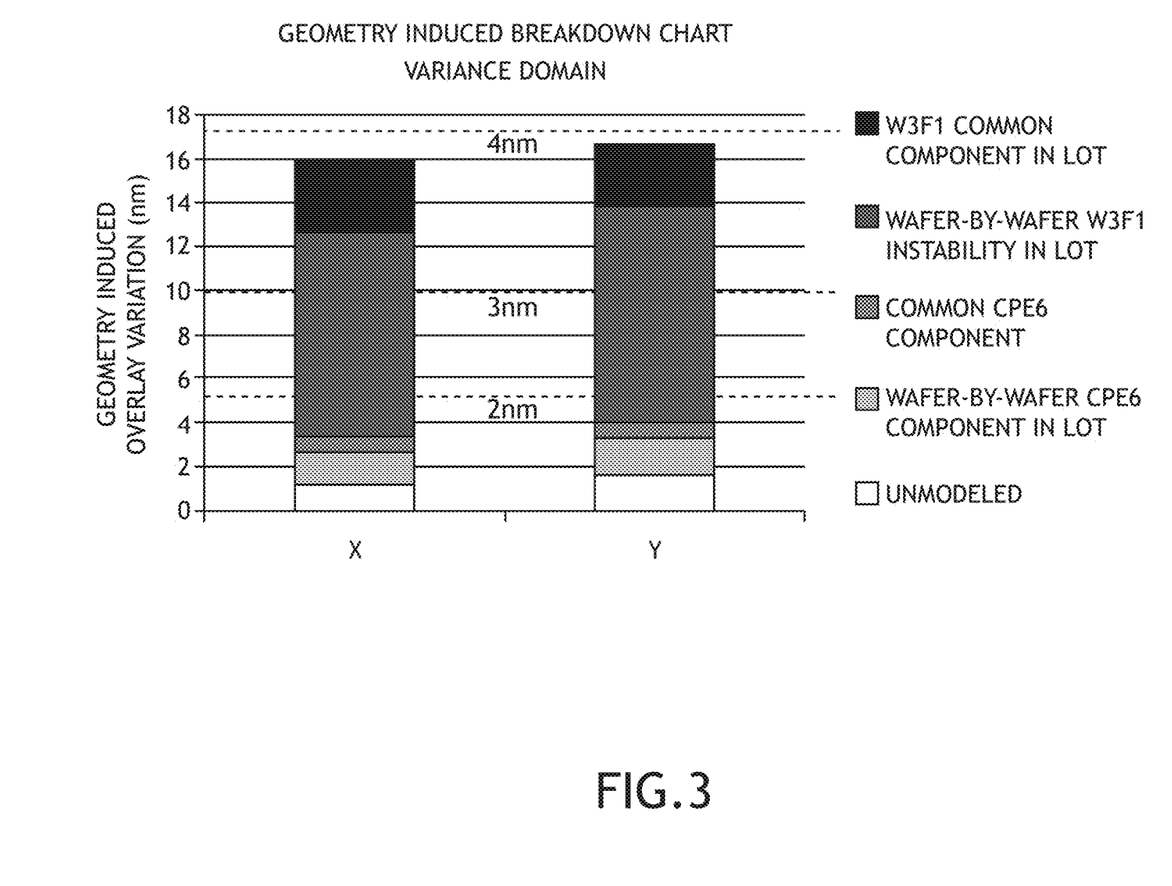
FIG. 3 is an illustration depicting a graphical representation of the breakdown analysis in a variance domain.

It is contemplated that the results of the breakdown analysis may be reported to a user. The report may include certain graphical representations. For instance, the breakdown analysis results may be represented in a standard deviation (e.g., 3-σ) domain or a variance domain, as depicted in FIGS. 2 and 3, respectively, to help a user to visualize the magnitude and impact of the various decomposed components. It is contemplated that various other types of reporting and/or statistical representations may also be utilized for reporting purposes without departing from the spirit and scope of the present disclosure.

Referring to the tabular overlay breakdown information provided in FIGS. 2 and 3, such information may be used by the user to identify which component of the overlay varies at a higher degree compared to other components. For example, FIG. 2 illustrates that the high order polynomial model wafer-to-wafer variation varies at a higher degree compared to all the other components. The user may use this information to control specific process(es) that might be causing the high order polynomial model wafer-to-wafer variations. Furthermore, the user may use a higher scanner alignment sampling strategy to improve the efficiency of the scanner alignment corrections to reduce the high order polynomial model wafer-to-wafer variations.

It is contemplated that the results of the breakdown analysis may also be utilized to improve control of the fabrication processes. For instance, process control systems may be utilized in wafer fabrication to manage process context information to automatically adjust and tune wafer processing. Lot-to-lot variations 106, high order polynomial model wafer-to-wafer variations 108, common CPE polynomial model 110, and wafer-to-wafer CPE model variations 112 extracted from the IPD 102 as described above may be provided to such control systems, which may in turn adjust and tune the wafer processing tool(s) to compensate for the signatures accordingly. Similarly, lot-to-lot variations 106 and wafer-to-wafer variations 108 may be provided to scanner alignment control systems, which may then be used to improve the efficiency of the scanner alignment control system (e.g., through scanner alignment, sampling optimization and other techniques available in a scanner) and better compensate for these variations accordingly.

It is contemplated that the effectiveness of the various scanner correction/compensation techniques may also be evaluated utilizing the results of the breakdown analysis. For instance, one or more decomposed components 104 through 112 may be obtained before and after applying a particular correction technique, and the effectiveness of this particular correction technique may be assessed based on the comparison of the before and after values of the decomposed components. It is noted that because this comparison can be carried out at the decomposed components level, it provides more granularity and better precision and accuracy than simply comparing at the top level overlay.

Figure 4:
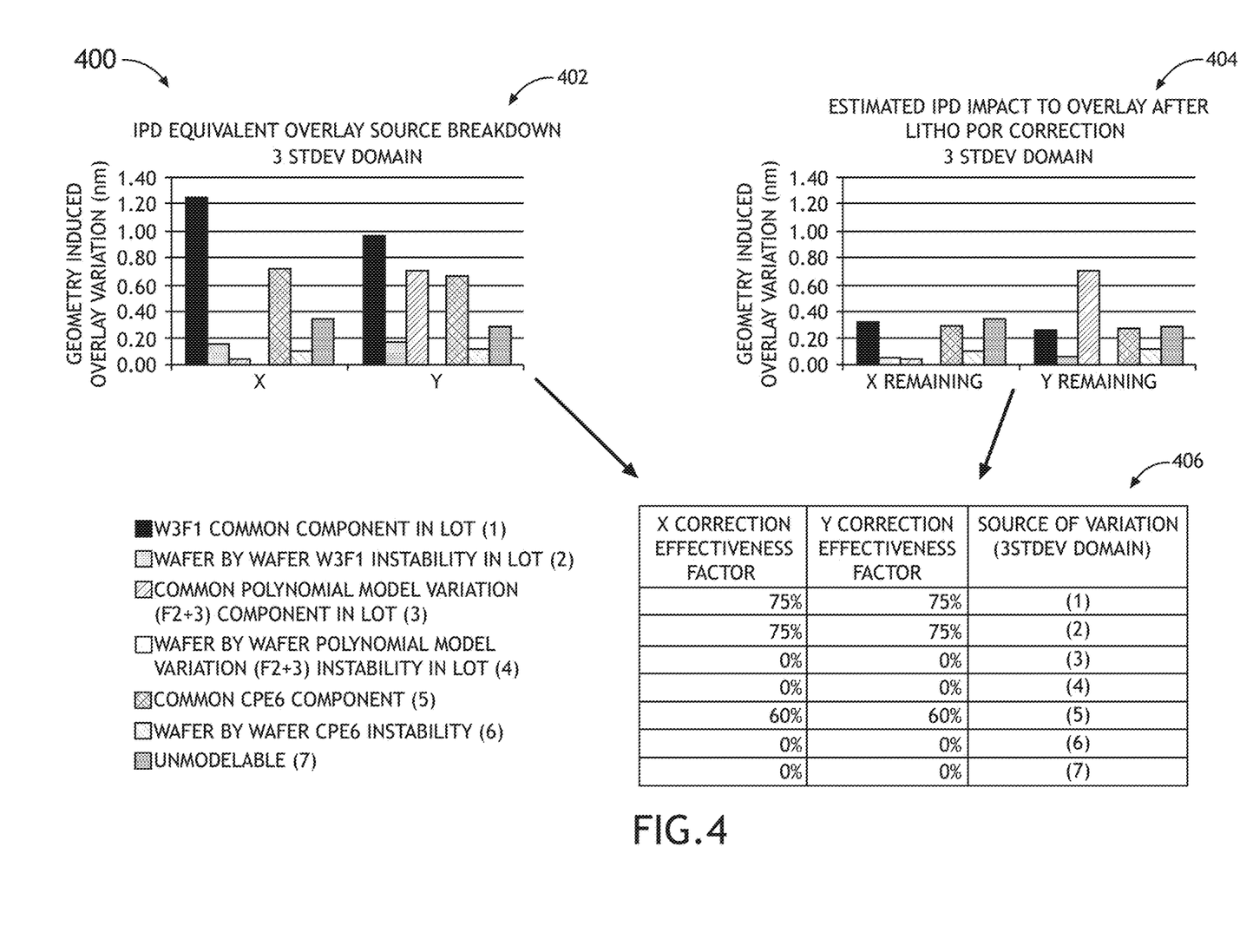
FIG. 4 is a flow diagram depicting an embodiment of a method for determining correction effectiveness factors associated with various components.

FIG. 4 is a flow diagram 400 depicting an embodiment of a method for determining the correction effectiveness factors associated with various decomposed components for a particular correction technique. In a step 402, the IPDs obtained (measured or estimated) prior to applying the correction technique are decomposed into the various components utilizing the breakdown analysis previously described. Similarly, in a step 404, the IPDs obtained (measured or estimated) after applying the correction technique (e.g., a lithography plan of record, or litho POR, correction technique) are broken down into the various components in the same manner. For illustrative purposes, the results of the breakdown analysis 402 and 404 are both represented in a standard deviation domain as depicted in FIG. 4. It is to be understood, however, that the representation of the results may vary without departing from the spirit and scope of the present disclosure, as long as the statistical information of the various components can be utilized for a comparison step 406.

An exemplary comparison result of step 406 is shown in FIG. 4 for illustrative purposes. In this example, it is shown that the effectiveness of the correction technique on the process signature variations 106 and 108 is about 75%. In other words, applying this correction technique helped reducing 75% of the process signature variations that would otherwise still be present without applying the correction technique. Similarly, the correction effectiveness on waferto-wafer variations 108, as well as other decomposed components, may also be determined based on this comparison.

It is contemplated that the correction effectiveness factors determined in this manner may be utilized to further improve control of the fabrication processes. The correction effectiveness factors may also be taken into consideration to calculate a more accurate prediction of the total geometry induced overlay variation. This total geometry induced overlay variation value may then be used for establishing run-time control specifications (lot based or wafer based) with more refined control limits.

Figure 5:
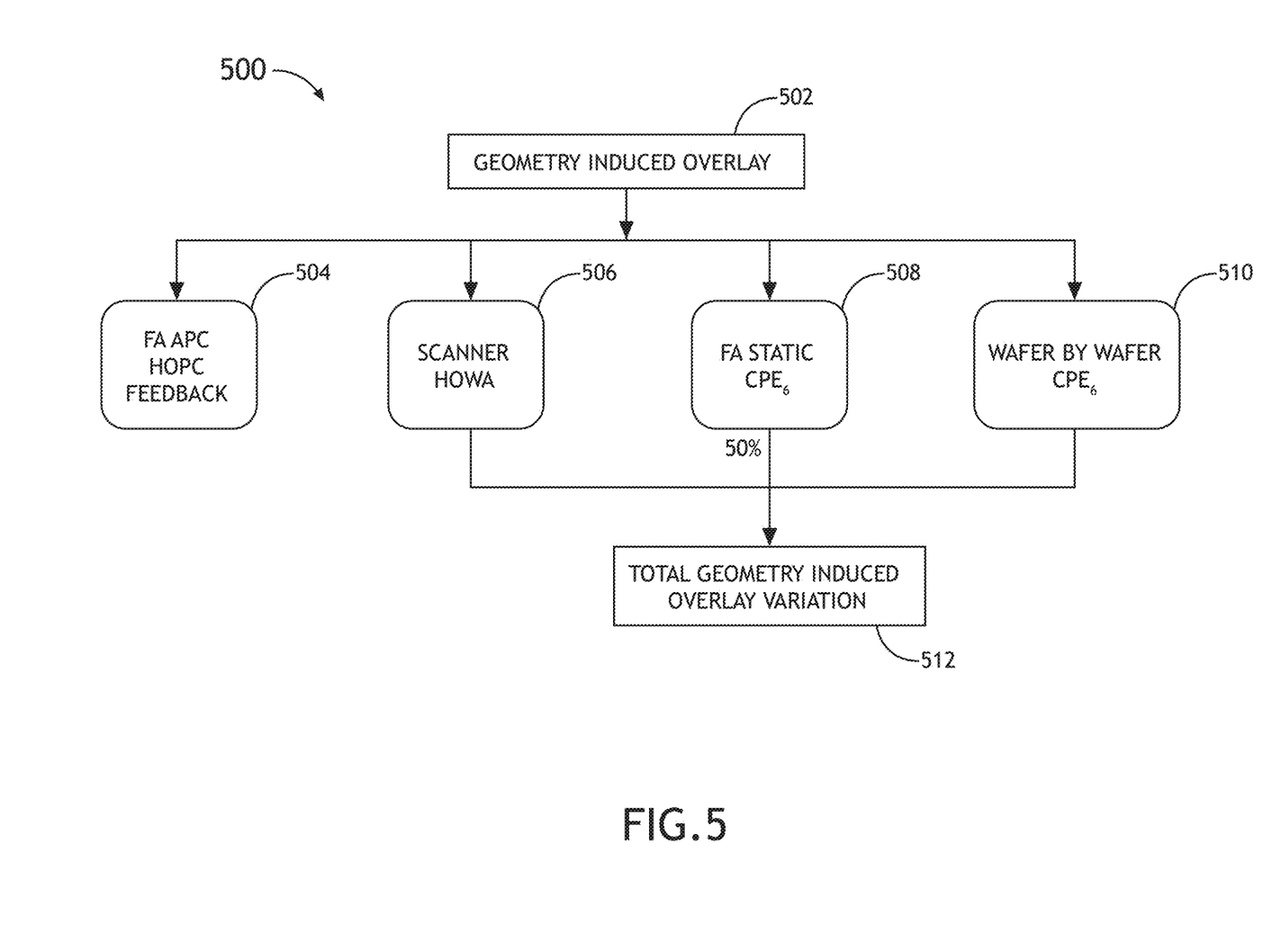
FIG. 5 is a flow diagram depicting an embodiment of a method for determining a total geometry induced overlay variation using the correction effectiveness factors.

FIG. 5 illustrates a process 500 of using the correction effectiveness factors to improve prediction of the total geometry induced overlay variation. In a step 502, geometry induced overlay (e.g., represented using IPD as previously described) may be obtained for a plurality of wafers. The breakdown analysis may be performed on the obtained overlay data to decompose the obtained overlay data into the various components described above. Also as described above, some of the decomposed components may be provided to certain control systems to facilitate the correction/compensation processes that may be carried out by the control systems. For instance, process signatures 104 may be provided to a control system in a step 504 (e.g., via feedback, factory automation advanced process control (FAAPC); or high order process correction (HOPC)) to adjust and tune a wafer processing tool to compensate for the process signatures. Similarly, the lot-to-lot variations 106 and the wafer-to-wafer variations 108 may be provided to a scanner alignment control system (e.g., higher order wafer alignment, or HOWA)) in a step 506 to compensate for these variations as well. In addition, if correction per exposure (CPE) techniques are used (e.g., wafer by wafer comparison, a $CPE_6$ model, and/or factory automation (FA) static correction in certain lithography tools and the like), the common residual 110 and the higher order wafer-to-wafer variations 112 may be provided to a CPE controller in steps 508 and 510 to facilitate the CPE process. In one example, the common residual 110 is provided along with a static PE file that the scanner may use to correct for common residuals and the higher order wafer-to-wafer variations 112 are provided to the scanner to facilitate more specific corrections on a wafer by wafer (W×W) basis.

To illustrate the use of correction effectiveness factors to calculate a more accurate prediction of the total geometry induced overlay variation, suppose that the correction effectiveness factors of the scanner alignment control and the correction per exposure techniques have been determined to be about 50%. In other words, about 50% of the wafer geometry induced overlay variations may be corrected by one or more correction techniques utilized in the fabrication control loops; that means, however, about 50% of the wafer geometry induced overlay variations may remain uncorrected. It is noted that the uncorrected geometry induced overlay variations should not be ignored. Instead, appropriate weights should be given to the various components based on the correction effectiveness factors of these components, and they should be accounted for in the sum that represents the total geometry induced overlay variation as calculated in a step 512.

Figure 6:
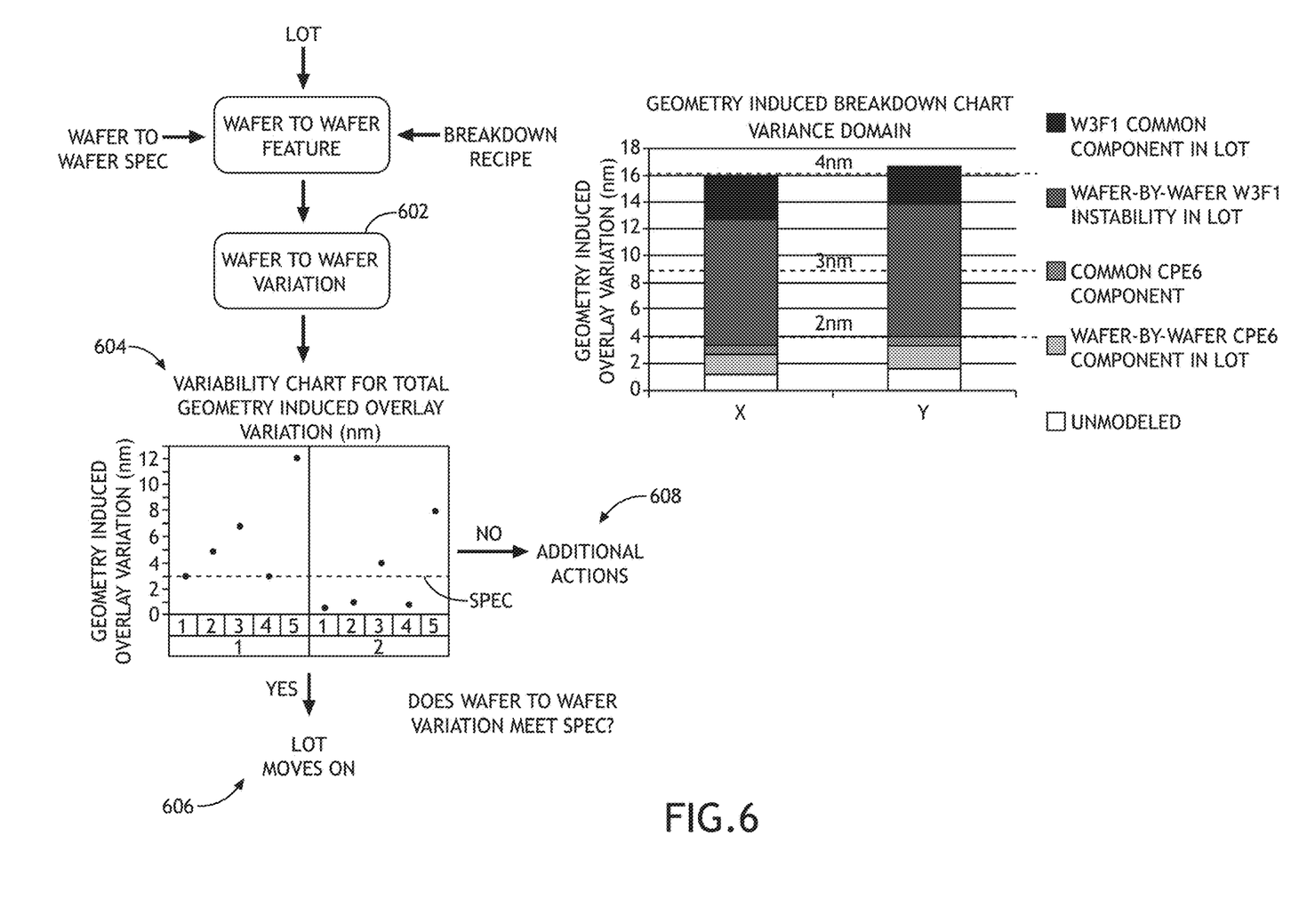
FIG. 6 is an illustration depicting a specification established based on the calculated total geometry induced overlay variation.

It is contemplated that the total geometry induced overlay variation calculated as described above may be utilized to provide wafer geometry induced overlay monitoring in a manner that complements fabrication feedback overlay control loops that may already be in use. FIG. 6 is an illustration depicting a specification established based on the calculated total geometry induced overlay variation 602. As shown in FIG. 6, the total geometry induced overlay variations 602 of multiple wafers from multiple lots may be examined in a step 604 together against a specification that may be considered acceptable (e.g., a certain percentage of the total overlay budget for a particular lithography patterning layer, such as 30%). For example, a lot whose wafer-to-wafer variation meets the specification may pass and may move on to the next fabrication process 606. However, a lot whose wafer-to-wafer variation exceeds the specification may be identified and further actions may be carried out in a step 608. It is contemplated that these actions may include, but are not limited to, reworking the lot in question, feed-forwarding IPDs of the wafers in the lot for compensation, identifying one or more fabrications processes that may have caused the variations, applying optimization, as well as various other techniques that may help reducing the variation of the impact of the variation.

It is to be understood that the specific percentage data depicted above is merely exemplary. The correction effectiveness factors of the various components may vary without departing from the spirit and scope of the present disclosure. Furthermore, it is contemplated that the specification established based on the process described above may be used in conjunction with various other parameters for monitoring and controlling purpose, or it may be used as a standalone parameter for quality control and/or other purposes.

To reiterate, in accordance with embodiments of the present disclosure, information regarding variations of the overlay errors is obtained and analyzed to improve the measurement and prediction accuracies. Embodiments of the present disclosure utilize a cascading analysis to breakdown the wafer geometry induced overlay into various components. In addition, the results of the breakdown analysis may be utilized to determine correction effectiveness factors for various correction techniques that may be employed. Furthermore, the correction effectiveness factors may be utilized to optimize correction strategies as well as estimate uncorrected wafer geometry induced overlay, and the estimated uncorrected wafer geometry induced overlay may be used for monitoring wafer geometry for overlay control.

Figure 7:
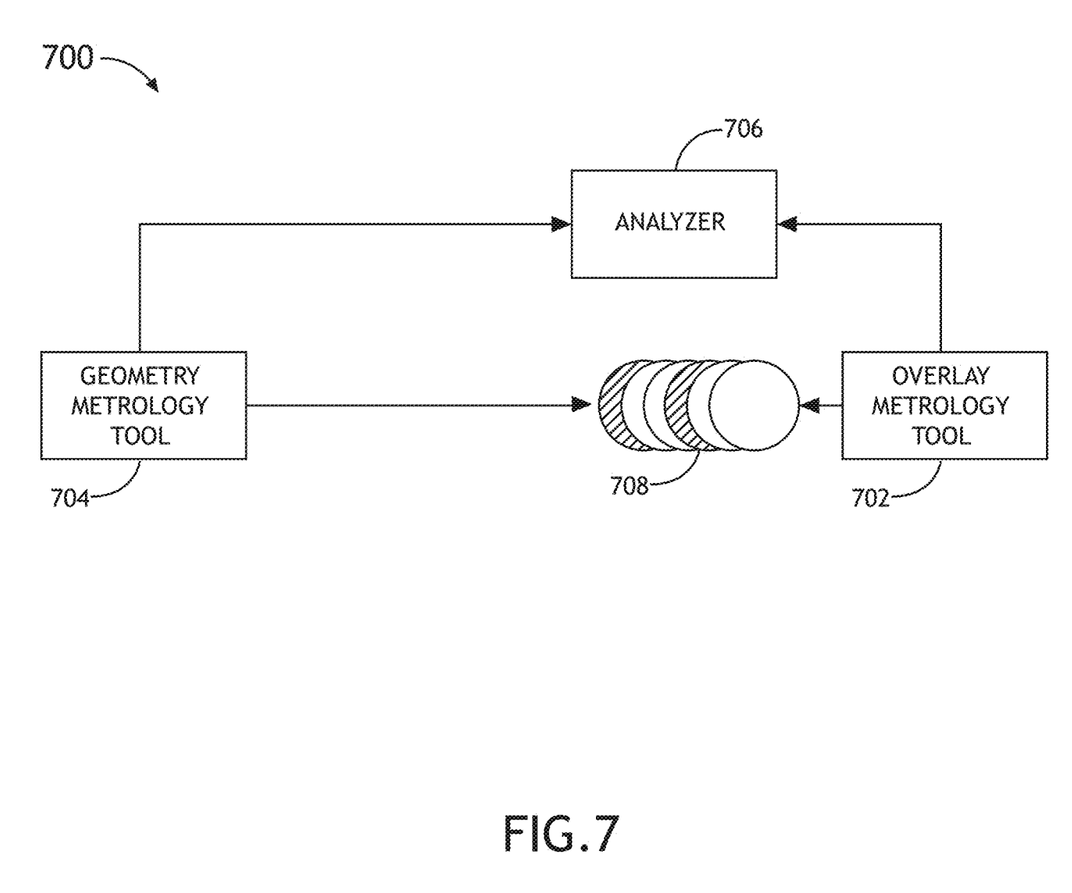
FIG. 7 is a block diagram depicting a system utilizing an analyzer in accordance with an embodiment of the present invention.

It is contemplated that the analysis processes described above can be implemented in various wafer geometry tools and metrology tools. FIG. 7 is a block diagram depicting a system 700 in accordance with one embodiment of the present disclosure. The system 700 may include an overlay metrology tool 702 configured to collect raw overlay signatures. The system 700 may also include a geometry metrology tool 704 configured to collect wafer geometry data from a set of wafers 708. The geometry metrology tool 704 may include a wafer geometry tool or any imaging device capable of collecting wafer geometry data, such as WaferSight metrology system from KLA-Tencor. It is to be understood that the overlay metrology tool 702 and the geometry metrology tool 704 may be implemented as separate devices. Alternatively, an integrated metrology system capable of measuring patterned wafers may be utilized for both overlay metrology and wafer geometry measurement.

The system 700 also includes an analyzer 706 in communication with both the overlay metrology tool 702 and the geometry metrology tool 704. The analyzer 706 may be implemented on a computer processor, a circuitry or the like, that is capable of carrying out the various analysis processes previously described. The analyzer 706 may also be configured to determine correction effectiveness factors for various correction techniques based on the results of the analysis. Furthermore, the analyzer 706 may utilize the correction effectiveness factors to estimate uncorrected wafer geometry induced overlay, and the estimated uncorrected wafer geometry induced overlay may be used for monitoring wafer geometry for overlay control as described above.

It is contemplated that while some of the examples above referred to certain specific process tools, the systems and methods in accordance with the present disclosure are applicable to other types of process tools, which may also benefit from improved overlay control without departing from the spirit and scope of the present disclosure. In addition, it is contemplated that while the examples above referred to wafer inspections, the systems and methods in accordance with the present disclosure are applicable to other types of polished plates as well without departing from the spirit and scope of the present disclosure. The term wafer used in the present disclosure may include a thin slice of semiconductor material used in the fabrication of integrated circuits and other devices, as well as other thin polished plates such as magnetic disc substrates, gauge blocks and the like.

The methods disclosed may be implemented in various wafer geometry measurement tools as sets of instructions executed by one or more processors, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A method, comprising:
   obtaining a first set of a plurality of in-plane distortions or measured overlay for a plurality of wafers, the plurality of wafers including wafers from multiple lots;
   obtaining a second set of the plurality of in-plane distortions or measured overlay for the plurality of wafers;
   decomposing the first set of the plurality of in-plane distortions or measured overlay obtained for the plurality of wafers to a first set of decomposed components utilizing a processor, the first set of decomposed components including: at least one of a common process signature, lot-to-lot variations, or wafer-to-wafer variations;
   decomposing the second set of the plurality of in-plane distortions or measured overlay to a second set of decomposed components utilizing the processor;
   determining a correction effectiveness factor of an overlay correction process based on a comparison between the first set of decomposed components and the second set of decomposed components; and
   generating one or more control signals based on at least the correction effectiveness factor, wherein the one or more control signals are configured to cause adjustment in one or more semiconductor fabrication process tools, wherein the correction effectiveness factor corresponds to a number of the plurality in-plane distortions or measured overlay reduced via an application of the overlay correction process.

2. The method of claim 1, wherein the first set of decomposed components further includes: a common residual across the plurality of wafers and higher order wafer-to-wafer variations.

3. The method of claim 1, wherein a sum of the decomposed components equals the plurality of in-plane distortions.

4. The method of claim 1, further comprising:
   displaying a statistical representation of at least one of the first set of decomposed components to a user.

5. The method of claim 4, wherein the statistical representation includes: at least one of a representation in a standard deviation domain or a representation in a variance domain.

6. The method of claim 1, wherein the one or more control signals are configured to cause adjustment by reducing the number of the plurality of in-plane distortions or measured overlay caused by one or more semiconductor fabrication processes of the one or more semiconductor fabrication process tools.

7. A method, comprising:
   obtaining a first set of a plurality of in-plane distortions for a plurality of wafers, the plurality of wafers including wafers from multiple lots, and the first set of the plurality of in-plane distortions obtained for the plurality of wafers representing in-plane distortions of the plurality of wafers prior to application of an overlay correction process;
   obtaining a second set of the plurality of in-plane distortions for the plurality of wafers, the second set of the plurality of in-plane distortions obtained for the plurality of wafers representing in-plane distortions of the plurality of wafers after an application of the overlay correction process;
   decomposing the first set of the plurality of in-plane distortions to a first set of decomposed components utilizing a processor;
   decomposing the second set of the plurality of in-plane distortions to a second set of decomposed components utilizing the processor;
   determining a correction effectiveness factor of the overlay correction process based on a comparison between the first set of decomposed components and the second set of decomposed components; and
   generating one or more control signals based on at least the correction effectiveness factor, wherein the one or more control signals are configured to cause adjustment in one or more semiconductor fabrication process tools, wherein the correction effectiveness factor corresponds to a number of the plurality in-plane distortions reduced via the application of the overlay correction process.

8. The method of claim 7, wherein each of the first and second sets of decomposed components includes: at least one of a common process signature, higher order polynomial model lot-to-lot variations, higher order polynomial model wafer-to-wafer variations, corrections per exposure (CPE) model common signature, or CPE model wafer-to-wafer variations.

9. The method of claim 7, wherein a sum of the first set of decomposed components equals the first set of the plurality of in-plane distortions and a sum of the second set of decomposed components equals the second set of the plurality of in-plane distortions.

10. The method of claim 7, wherein the second set of the plurality of in-plane distortions is measured after lithography process using an overlay metrology tool.

11. The method of claim 7, further comprising:
displaying the correction effectiveness factor of the overlay correction process to a user.

12. The method of claim 7, wherein the one or more control signals are configured to cause adjustment by reducing the number of the plurality of in-plane distortions caused by one or more semiconductor fabrication processes of the one or more semiconductor fabrication process tools.

13. A method, comprising:
analyzing a first set of wafers to determine a correction effectiveness factor of an overlay correction process utilized in wafer fabrication, the first set of wafers including a plurality of wafers from multiple lots, wherein the correction effectiveness factor corresponds to a number of a plurality in-plane distortions reduced via an application of the overlay correction process;
obtaining a plurality of in-plane distortions for a second set of wafers, the second set of wafers including a plurality of wafers from multiple lots;
decomposing the plurality of in-plane distortions of the second set of wafers to a plurality of decomposed components, the plurality of decomposed components including: at least one of a common process signature, higher order polynomial model lot-to-lot variations, higher order polynomial model wafer-to-wafer variations, corrections per exposure (CPE) model common signature, or CPE model wafer-to-wafer variations;
calculating a total geometry induced overlay variation for the second set of wafers based on a weighted sum of the plurality of decomposed components, wherein at least one decomposed component of the plurality of decomposed components is weighted at least partially based on the correction effectiveness factor of the overlay correction process;
determining whether the second set of wafers satisfies an established specification based on comparison of the total geometry induced overlay variation for the second set of wafers against the established specification; and
generating one or more control signals based on at least the total geometry induced overlay variation, wherein the one or more control signals are configured to cause adjustment in one or more semiconductor fabrication process tools.

14. The method of claim 13, wherein the specification is established as a percentage of an overlay budget for a particular lithography patterning layer.

15. The method of claim 13, wherein the analyzing step further includes:
obtaining a first set of the plurality of in-plane distortions for the first set of wafers, the first set of the plurality of in-plane distortions obtained for the first set of wafers representing in-plane distortions of the first set of wafers prior to application of the overlay correction process;
obtaining a second set of the plurality of in-plane distortions for the first set of wafers, the second set of the plurality of in-plane distortions obtained for the first set of wafers representing in-plane distortions of the first set of wafers after application of the overlay correction process;
decomposing the first set of the plurality of in-plane distortions to a first set of decomposed components;
decomposing the second set of the plurality of in-plane distortions to a second set of decomposed components; and
determining the correction effectiveness factor of the overlay correction process based on a comparison between the first set of decomposed components and the second set of decomposed components.

16. The method of claim 13, wherein the first set of wafers and the second set of wafers are the same.

17. The method of claim 13, wherein the first set of wafers and the second set of wafers are different.

18. The method of claim 13, wherein a sum of the decomposed components equals the plurality of in-plane distortions.

19. The method of claim 13, wherein the one or more control signals are configured to cause adjustment by reducing the number of the plurality of in-plane distortions caused by one or more semiconductor fabrication processes of the one or more semiconductor fabrication process tools.

20. A system, comprising:
a measurement device configured to obtain wafer geometry data from a first set of wafers, the first set of wafers including a plurality of wafers from multiple lots;
one or more semiconductor fabrication process tools configured to perform one or more semiconductor fabrication processes; and
an analyzer in communication with the measurement device, the analyzer configured to:
calculate a first set of a plurality of in-plane distortions for the first set of wafers;
calculate a second set of the plurality of in-plane distortions for the first set of wafers;
decompose the first set of the plurality of in-plane distortions to a first set of decomposed components, the first set of decomposed components including: at least one of a common process signature, higher order polynomial model lot-to-lot variations, higher order polynomial model wafer-to-wafer variations, corrections per exposure (CPE) model common signature, or CPE model wafer-to-wafer variations;
decompose the second set of the plurality of in-plane distortions to a second set of decomposed components;
determine a correction effectiveness factor for an overlay correction process based on a comparison between the first set of decomposed components and the second set of decomposed components; and
generate one or more control signals based on at least the correction effectiveness factor, wherein the one or more control signals are configured to cause adjustment in the one or more semiconductor fabrication process tools,
wherein the correction effectiveness factor corresponds to the number of the plurality in-plane distortions reduced via an application of the overlay correction process.

21. The system of claim 20, wherein a sum of the decomposed components equals the plurality of in-plane distortions.

22. The system of Claim 20, wherein the analyzer is further configured to:
calculate a plurality of in-plane distortions for a second set of wafers, the second set of wafers including wafers from multiple lots;
decompose the plurality of in-plane distortions of the second set of wafers to a plurality of decomposed components, the plurality of decomposed components including: a common process signature, higher order polynomial model lot-to-lot variations, higher order polynomial model wafer-to-wafer variations, CPE model common signature, and CPE model wafer-to-wafer variations;

calculate a total geometry induced overlay variation for each wafer of the second set of wafers based on a weighted sum of the plurality of decomposed components, wherein at least one decomposed component of the plurality of decomposed components is weighted at least partially based on the correction effectiveness factor of the overlay correction process;

determine whether the second set of wafers satisfies an established specification based on comparison of the total geometry induced overlay variation for the second set of wafers against the established specification; and generate one or more control signals based on at least the total geometry induced overlay variation, wherein the one or more control signals are configured to cause adjustment in the one or more semiconductor fabrication process tools.

23. The system of claim 22, wherein the specification is established as a percentage of an overlay budget for a particular lithography patterning layer.

24. The system of claim 22, wherein the first set of wafers and the second set of wafers are the same.

25. The system of claim 22, wherein the first set of wafers and the second set of wafers are different.

26. The system of claim 20, wherein the one or more control signals are configured to cause adjustment by reducing the number of the plurality of in-plane distortions caused by the one or more semiconductor fabrication processes of the one or more semiconductor fabrication process tools.

* * * * *